US011588311B2

(12) United States Patent
Park et al.

(10) Patent No.: US 11,588,311 B2
(45) Date of Patent: Feb. 21, 2023

(54) CONNECTOR SYSTEM

(71) Applicants: Hyundai Motor Company, Seoul (KR); Kia Motors Corporation, Seoul (KR)

(72) Inventors: Jeong Hee Park, Suwon-si (KR); Tae Young Kim, Suwon-si (KR); Byung Hwa Oh, Yongin-si (KR); Jong Myeong Kim, Seongnam-si (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 266 days.

(21) Appl. No.: 17/150,211

(22) Filed: Jan. 15, 2021

(65) Prior Publication Data

US 2022/0060008 A1 Feb. 24, 2022

(30) Foreign Application Priority Data

Aug. 20, 2020 (KR) ........................ 10-2020-0104815

(51) Int. Cl.
*H02G 3/08* (2006.01)
*H05K 7/20* (2006.01)

(52) U.S. Cl.
CPC ......... *H02G 3/083* (2013.01); *H05K 7/20581* (2013.01)

(58) Field of Classification Search
CPC . H02G 3/30; H02G 5/10; H01B 11/02; H01B 11/1091; H01B 11/125; H01B 11/1891; H01B 7/2825; H01B 9/003; H01B 7/08; H01B 7/0063; H01B 7/0876; H01B 7/2813; H01B 7/0072; H01B 7/0892; H01B 7/421; H01B 7/1855; H01B 7/226; H01B 11/00; H01B 7/18; H01B 7/295
See application file for complete search history.

(56) References Cited

U.S. PATENT DOCUMENTS 3,636,496 A * 1/1972 Jenkins .................. H01B 9/001 439/502
5,617,898 A * 4/1997 Nagai ................ F15B 13/0864 137/884

(Continued)

FOREIGN PATENT DOCUMENTS

| | | | |
|---|---|---|---|
| JP | 3019104 | U | 12/1995 |
| KR | 101847165 | B1 | 4/2018 |
| KR | 101911500 | B1 | 10/2018 |

*Primary Examiner* — Krystal Robinson
(74) *Attorney, Agent, or Firm* — Slater Matsil, LLP

(57) ABSTRACT

A connector system includes a first connector configured to be electrically connected to a predetermined device required for air discharge and to introduce air discharged from the predetermined device into the first connector, a first connection line surrounding a first cable electrically connected to the first connector, one side of the first connection line being connected to the first connector, and a second connector connected to an opposite side of the first connection line and electrically connected to the first cable, wherein the first connector, the first connection line, and the second connector are configured to communicate with each other such that the air introduced into the first connector is discharged through the second connector after passing through the first connection line.

19 Claims, 15 Drawing Sheets

10 11 124 100 123 22 20 21 110 120 122 121 130 30

(56) References Cited

U.S. PATENT DOCUMENTS

| | | | | |
|---|---|---|---|---|
| 6,483,022 | B1 * | 11/2002 | Packard | H01B 7/0063 174/15.1 |
| 9,148,975 | B2 | 9/2015 | Fricker | |
| 2012/0019990 | A1 | 1/2012 | Segar et al. | |
| 2012/0199390 | A1 | 8/2012 | Oka et al. | |
| 2013/0342996 | A1 | 12/2013 | Fricker | |

* cited by examiner

CONNECTOR SYSTEM

CROSS-REFERENCE TO RELATED APPLICATIONS

This application claims the benefit of Korean Application No. 10-2020-0104815, filed on Aug. 20, 2020, which application is hereby incorporated herein by reference.

TECHNICAL FIELD

The present disclosure relates to a connector system.

BACKGROUND

In general, a bearing is a mechanical element that fixes a rotating shaft of a rotating device to a specific position while rotatably supporting the rotating shaft.

Among bearings, an airfoil bearing is to support a load by forming a boundary layer as air, which is a viscous fluid, is introduced between a foil, which is in contact with a rotor, and the rotor due to the high-speed rotation of the rotor. Such an airfoil bearing is mainly used in an air compressor.

The inner structure of the airfoil bearing may be deformed due to frictional heat generated due to high-speed rotation, and the airfoil bearing may be damaged when the inner structure is deformed. Accordingly, recently, an airfoil bearing having a cooling structure has been developed.

FIG. 1 is a view illustrating a conventional air compressor 1. The conventional air compressor 1 has employed a manner of transferring hot air, which is output after passing through a secondary flow passage configured for the cooling of the airfoil bearing 2, to an impeller entrance 5 through a hollow 4 of a shaft 3. The hot air is mixed with newly introduced air at the impeller entrance 5, thereby degrading the efficiency of the compressor.

In addition, the structure to connect the secondary flow passage to a system exhaust may be considered. The exhaust contains a lot of moisture due to the characteristics of a fuel cell. According to the structure to connect the secondary flow passage to the system exhaust, when a pressure reversal phenomenon occurs in which the exhaust pressure becomes greater than the discharge pressure of the secondary flow passage, the air containing the moisture is introduced into the compressor, thereby causing fatal damage to the compressor.

SUMMARY

The present disclosure may solve problems occurring in the prior art while advantages achieved by the prior art are maintained intact.

An embodiment of the present disclosure provides a connector system which includes an additional cooling flow passage to discharge hot air, which is generated from a predetermined device required for air discharge, to the outside without passing through the system exhaust.

The technical problems to be solved by embodiments of the present disclosure are not limited to the aforementioned problems, and any other technical problems not mentioned herein will be clearly understood from the following description by those skilled in the art to which the present disclosure pertains.

According to an embodiment of the present disclosure, a connector system may include a first connector provided to be electrically connected to a predetermined device required for air discharge and provided to introduce air discharged from the predetermined device into the first connector, a first connection line provided to surround a first cable electrically connected to the first connector, and including one side connected to the first connector, and a second connector connected to an opposite side of the first connection line and electrically connected to the first cable. The first connector, the first connection line, and the second connector may communicate with each other such that the air introduced into the first connector is discharged through the second connector after passing through the first connection line.

According to another embodiment, the second connector may be provided to be electrically connected to a controller configured to control the predetermined device.

According to another embodiment, the second connector may communicate with one distal end of a controller inner flow passage, when connected to the controller, such that the air discharged from the second connector is introduced into the controller inner flow passage which extends through an inner part of the controller.

According to another embodiment, the air discharged from the second connector may be discharged to an outside through a vent-out filter coupled to an opposite distal end of the controller inner flow passage after passing through the controller inner flow passage.

According to another embodiment, the connector system may further include a third connector coupled to an opposite distal end of the controller inner flow passage, a second connection line provided to surround a second cable electrically connected to the third connector, and including one side connected to the third connector, and a fourth connector connected to an opposite side of the second connection line and electrically connected to the second cable. The third connector, the second connection line, and the fourth connector may communicate with each other such that air introduced into the third connector from the controller inner flow passage is discharged through the fourth connector after passing through the second connection line.

According to another embodiment, the fourth connector may be provided to be electrically connected to a junction box.

According to another embodiment, the fourth connector may communicate with one distal end of a junction box inner flow passage, when connected to the junction box, such that the air discharged from the fourth connector is introduced into the junction box inner flow passage which extends through an inner part of the junction box.

According to another embodiment, the air discharged from the fourth connector may be discharged to an outside through a vent-out filter coupled to an opposite distal end of the junction box inner flow passage after passing through the junction box inner flow passage.

According to another embodiment, the second connector may be provided to be electrically connected to a junction box.

According to another embodiment, the second connector may communicate with one distal end of a junction box inner flow passage, when connected to the junction box, such that the air discharged from the second connector is introduced into the junction box inner flow passage which extends through an inner part of the junction box.

According to another embodiment, the first connector may include a first connector body provided to be connected to the predetermined device, a first connector terminal disposed in the first connector body and provided to be electrically connected to the predetermined device, and a first connector flow passage disposed in the first connector body and communicating with the predetermined device such that the air discharged from the predetermined device is introduced into the first connector flow passage. A space, in which the first connector terminal is disposed, may not be overlapped with a space, in which the first connector flow passage is disposed, in the first connector body.

According to another embodiment, the first connection line may include a first connection line body provided to surround the first cable, and a first connection line flow passage provided in the first connection line body and communicating with the first connector flow passage. A space, in which the first cable is disposed, may not be overlapped with a space, in which the first connection line flow passage is disposed, in the first connector body.

According to another embodiment, a diameter of the first connection line flow passage may be formed to be greater than a diameter of the first connector flow passage such that a portion of the first connector flow passage is inserted into the first connection line flow passage.

According to another embodiment, the connector system may further include a first sealing member that seals a joint part between the first connection line flow passage and the first connector flow passage.

According to another embodiment, the first connection line flow passage may include a first connection pipe disposed to be spaced apart from the first cable and to allow the first connector flow passage to communicate with the second connector.

According to another embodiment, the first connector terminal may include a U/V/W three-phase terminal, and the first cable may include a three-phase cable connected to the U/V/W three-phase terminal.

According to another embodiment, the second connector may include a second connector body provided to be connected to the controller, a second connector terminal disposed in the second connector body and provided to be electrically connected to the controller, and a second connector flow passage disposed in the second connector body, and communicating with the first connection line such that the air discharged from the first connection line is introduced into the second connector flow passage. A space, in which the second connector terminal is disposed, may not be overlapped with a space, in which the second connector flow passage is disposed, in the second connector body.

According to another embodiment, the predetermined device may include one of an air compressor, a water pump, or an air fan.

According to another embodiment, the predetermined device may include an airfoil bearing in the predetermined device, and the air discharged from the predetermined device may be air heated after cooling the airfoil bearing.

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF ILLUSTRATIVE EMBODIMENTS

Figure 1:
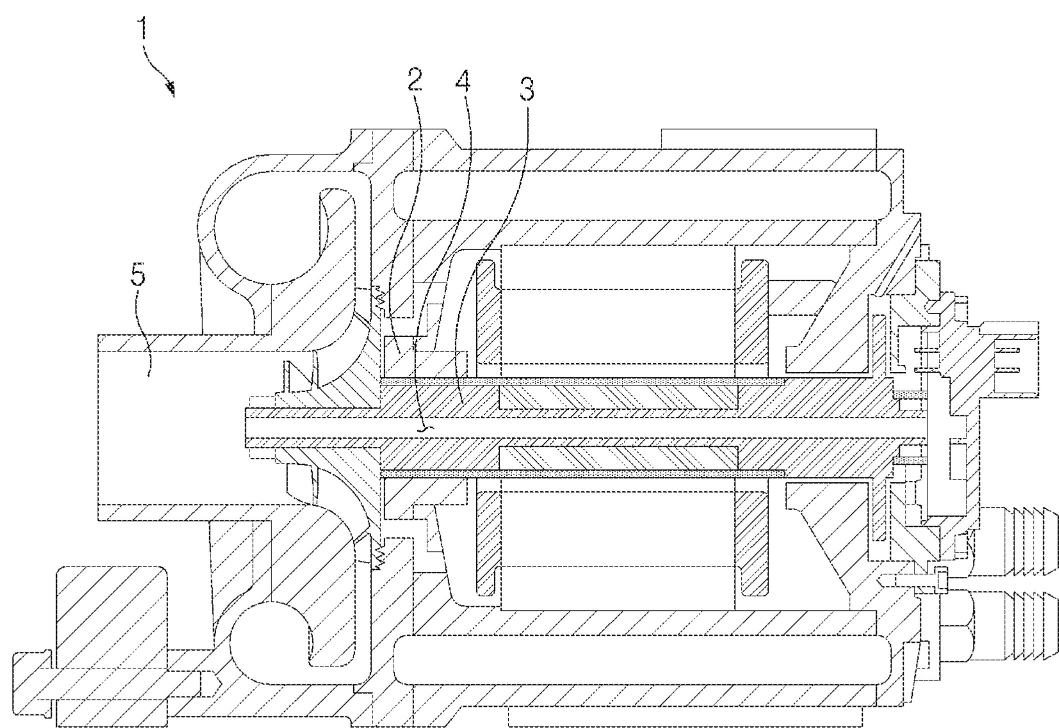
FIG. 1 is a view illustrating a conventional air compressor.

Hereinafter, some embodiments of the present disclosure will be described in detail with reference to the exemplary drawings. In adding the reference numerals to the components of each drawing, it should be noted that the identical or equivalent component is designated by the identical numeral even when they are displayed on other drawings. Further, in describing the embodiments of the present disclosure, a detailed description of well-known features or functions will be omitted in order not to unnecessarily obscure the gist of the present disclosure.

FIG. 1 is a view illustrating a conventional air compressor 1. The conventional air compressor 1 has employed a manner of transferring hot air, which is output after passing through a secondary flow passage configured for the cooling of the airfoil bearing 2, to an impeller entrance 5 through a hollow 4 of a shaft 3. The hot air is mixed with newly introduced air at the impeller entrance 5, thereby degrading compressor efficiency.

Figure 2:
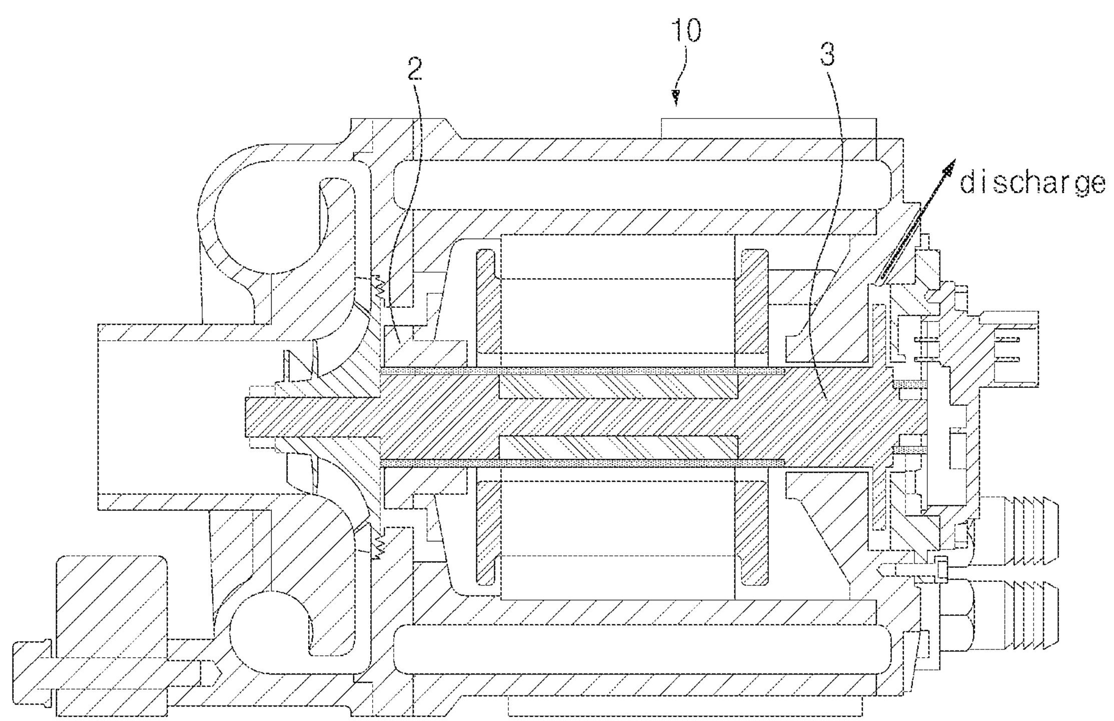
FIG. 2 is a view illustrating an air compressor connected to a connector system, according to a first embodiment of the present disclosure.

FIG. 2 is a view illustrating an air compressor connected to a connector system, according to a first embodiment of the present disclosure. To solve problems in the prior art, as in the air compressor illustrated in FIG. 2, there may be considered a structure to connect the secondary flow passage, which is configured for the cooling of the airfoil bearing 2, to the system exhaust, without forming a hollow in the shaft 3 of the air compressor 10. In this case, the hollow does not need to be formed in the shaft 3, so costs may be reduced.

Due to the characteristics of a fuel cell, exhaust contains a lot of moisture. According to the structure to connect the secondary flow passage to the system exhaust, when the pressure reversal occurs in which the exhaust pressure becomes greater than the discharge pressure of the secondary flow passage, the air containing moisture is introduced into the compressor, thereby causing fatal damage to the compressor.

According to embodiments of the present disclosure, a flow passage, which is to discharge hot air generated from the air compressor 10, is formed in the connector for the electrical connection, such that the flow passage is formed separately from the system exhaust. Accordingly, the hot air may be transferred to the outside without the pressure reversal resulting from the system exhaust, thereby preventing the damage to the air compressor 10 due to the pressure reversal.

First Embodiment

A first embodiment of the present disclosure relates to a connector system to discharge hot air, which is generated from a predetermined device required for air discharge, to the outside without passing through the system exhaust. The predetermined device required for air discharge includes an air compressor, a water pump, or an air fan by way of example. The following description will be made regarding an air compressor 10 (see FIG. 2) as the example of the predetermined device required for air discharge.

Air Compressor 10

FIG. 2 is a view illustrating an air compressor connected to a connector system, according to the first embodiment of the present disclosure. The air compressor 10 may include an airfoil bearing 2 therein. The air discharged out of the air compressor 10 may be air heated after the airfoil bearing 2 is cooled.

Figure 3:
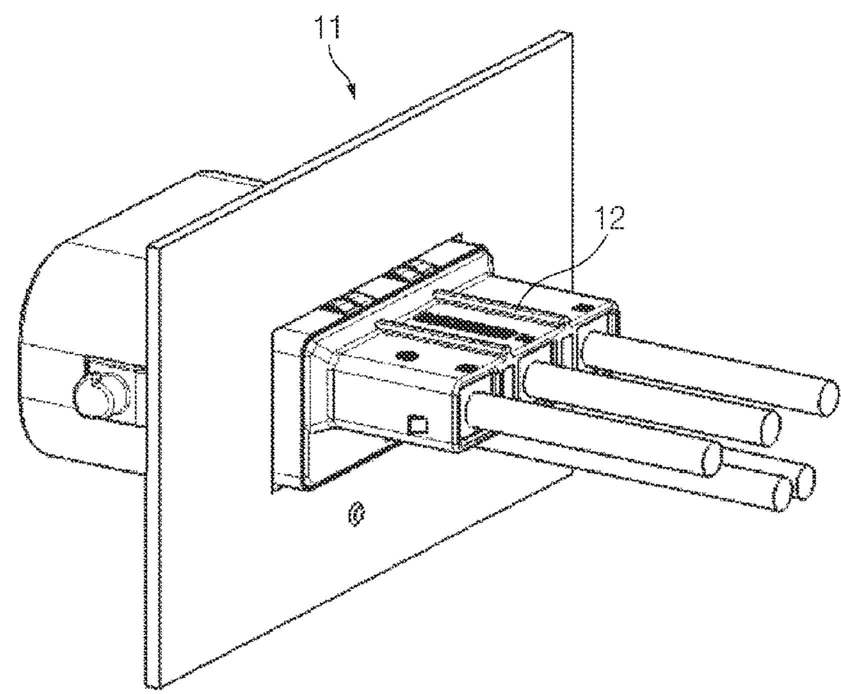
FIG. 3 is a perspective view illustrating an air compressor connector.
Figure 4:
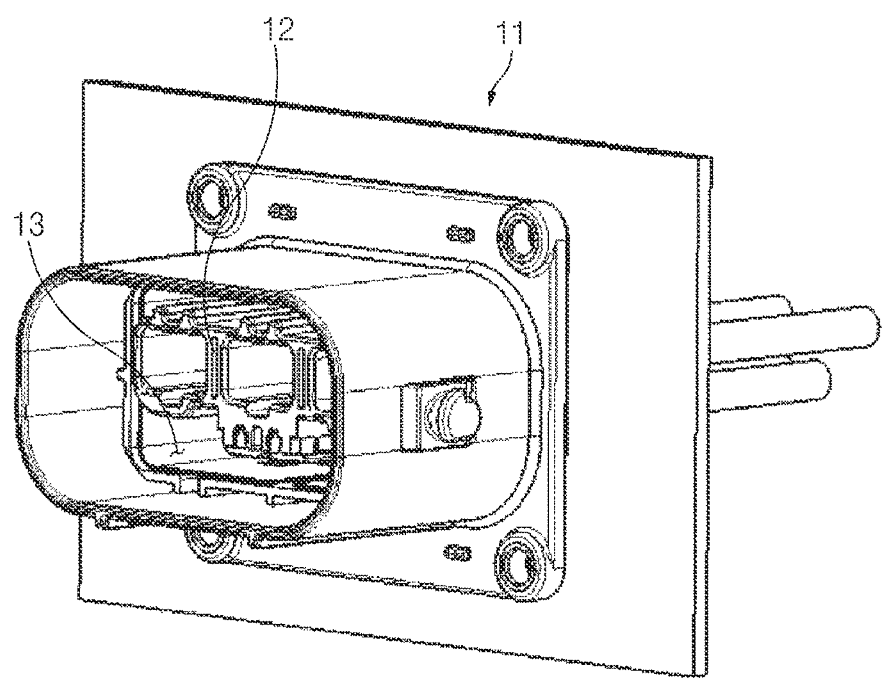
FIG. 4 is a perspective view illustrating the air compressor connector of FIG. 3 when viewed at a different angle.
Figure 5:
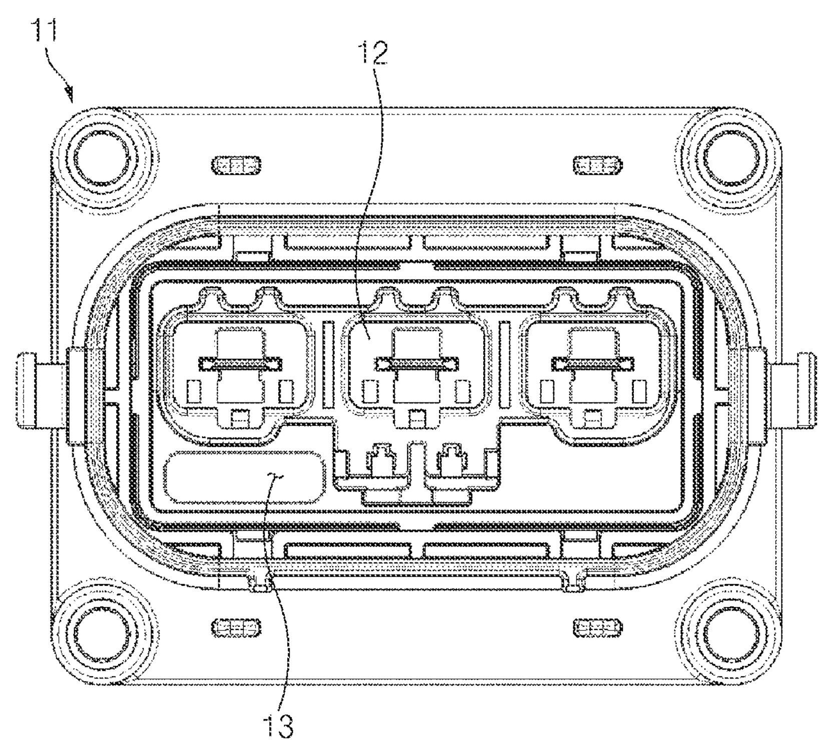
FIG. 5 is a sectional view illustrating the air compressor connector of FIG. 3.

The air compressor 10 may further include an air compressor connector 11. FIG. 3 is a perspective view illustrating an air compressor connector, and FIG. 4 is a perspective view illustrating the air compressor connector of FIG. 3 when viewed at a different angle. FIG. 5 is a sectional view illustrating the air compressor connector of FIG. 3. The air compressor connector 11 may be electrically connected to the air compressor 10.

As illustrated in FIGS. 3 to 5, the air compressor connector 11 may include an air compressor connector terminal 12 and an air compressor connector flow passage 13. The air compressor connector flow passage 13 is to pass air which is discharged from the air compressor 10.

In the air compressor connector 11, a space in which the air compressor connector terminal 12 is disposed may not be overlapped with a space in which the air compressor connector flow passage 13 is disposed. In other words, the air compressor connector flow passage 13 may be disposed in a dummy space of the air compressor connector 11 other than the space in which the air compressor connector terminal 12 is disposed. As the space in which the air compressor connector terminal 12 is disposed is separated from the space in which the air compressor connector flow passage 13 is disposed, the air compressor connector terminal 12 may be prevented from being deformed or broken by the hot air introduced into the air compressor connector flow passage 13.

Figure 6:
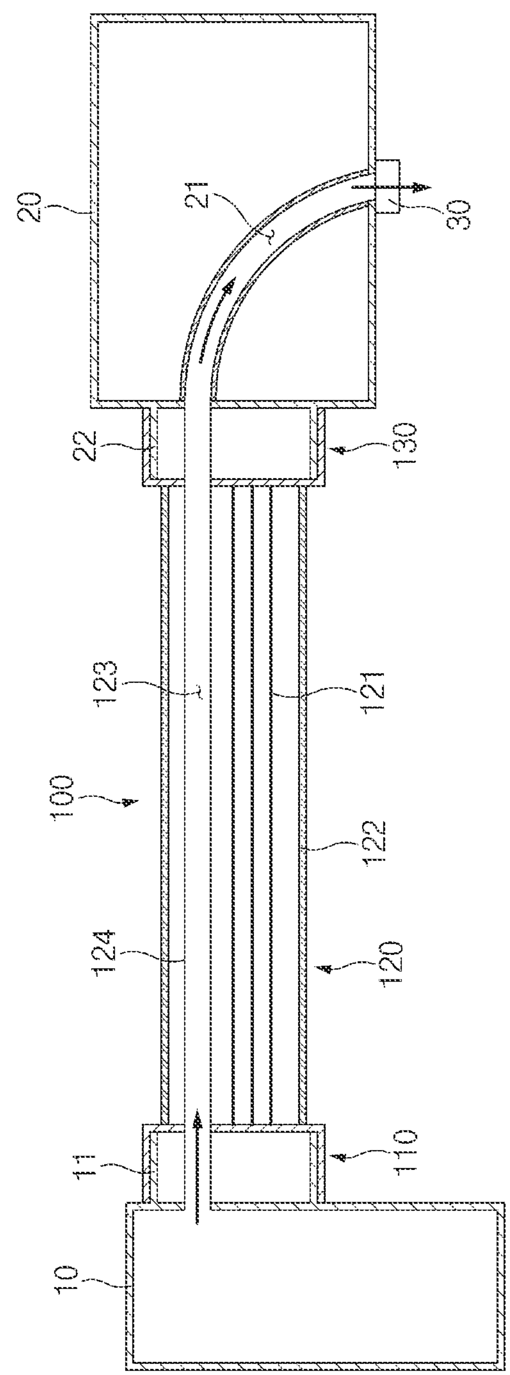
FIG. 6 is a view schematically illustrating a connector system, according to the first embodiment of the present disclosure.

Basic Configuration of Connector System 100 According to First Embodiment FIG. 6 is a view schematically illustrating a connector system, according to a first embodiment of the present disclosure. According to the first embodiment of the present disclosure, the connector system 100 may include a first connector 110, a first connection line 120, and a second connector 130. The first connector 110 may be provided to introduce the air discharged from the air compressor 10. The first connector 110 may be provided to be electrically connected to the air compressor 10.

The first connection line 120 may be provided to surround a first cable 121 electrically connected to the first connector 110. One side of the first connection line 120 may be connected to the first connector 110.

The second connector 130 may be electrically connected to the first cable 121. The second connector 130 may be connected to an opposite side of the first connection line 120. In other words, the first connector 110, the first connection line 120, and the second connector 130 may be sequentially connected to each other. As the first connector 110, the first connection line 120, and the second connector 130 are connected to each other, the first connector 110, the first connection line 120, and the second connector 130 may communicate with each other such that air introduced into the first connector 110 is discharged through the second connector 130 via the first connection line 120.

First Connector 110

Figure 7:
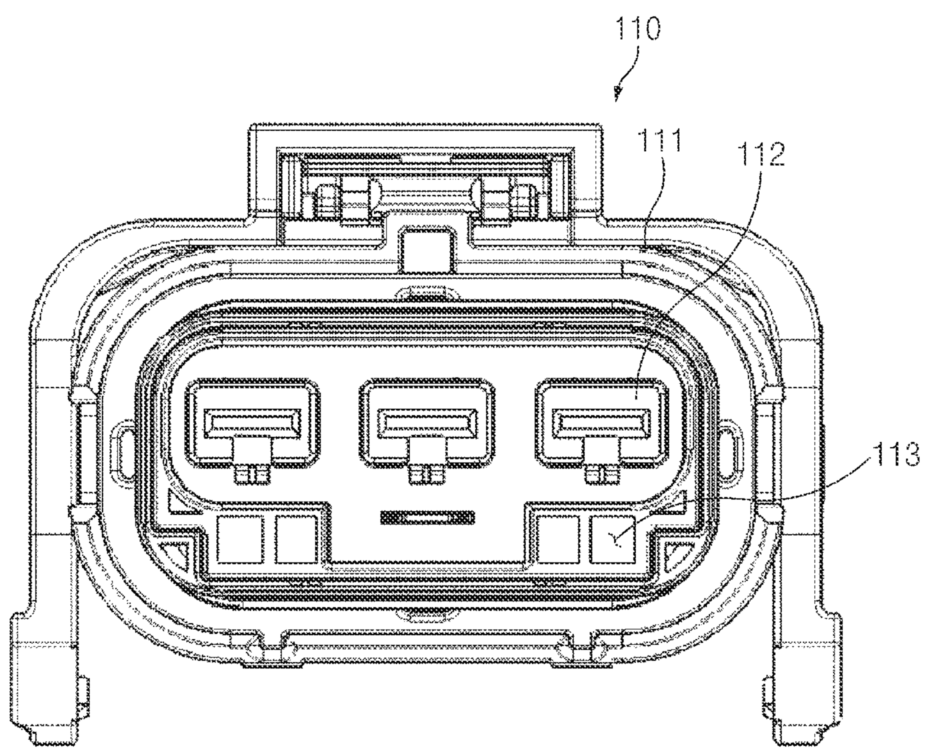
FIG. 7 is a sectional view illustrating a first connector of a connector system, according to the first embodiment of the present disclosure.
Figure 8:
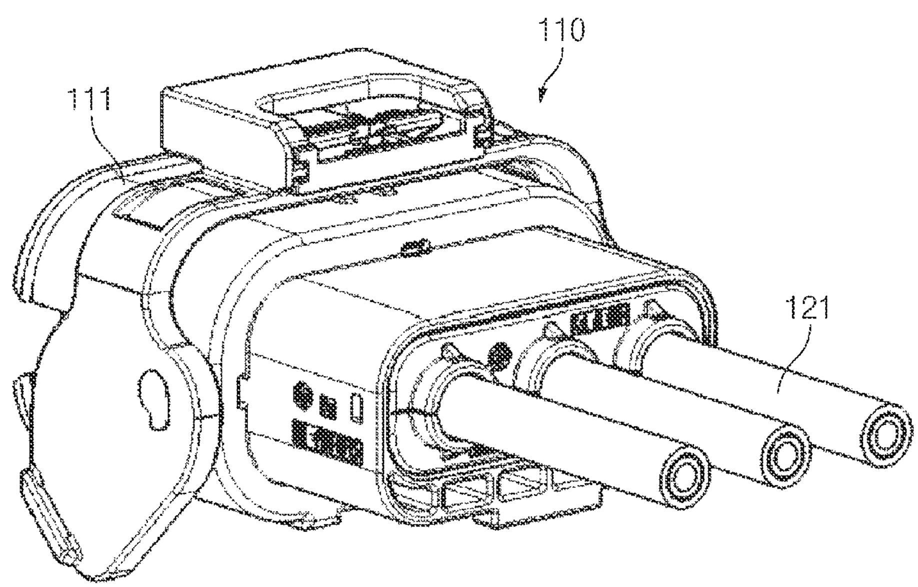
FIG. 8 is a perspective view illustrating a first connector and a first cable in a connector system, according to the first embodiment of the present disclosure.

FIG. 7 is a sectional view illustrating a first connector of a connector system, according to the first embodiment of the present disclosure. FIG. 8 is a perspective view illustrating a first connector and a first cable in a connector system, according to the first embodiment of the present disclosure.

As illustrated in FIG. 7, the first connector 110 may include a first connector body 111, a first connector terminal 112, and a first connector flow passage 113. The first connector body 111 may be provided to be electrically connected to the air compressor 10. The first connector body 111 may be engaged with the air compressor connector 11.

The first connector terminal 112 may be disposed within the first connector body 111. The first connector terminal 112 may be provided to be electrically connected to the air compressor 10. The first connector terminal 112 may be electrically connected to the air compressor connector terminal 12.

The first connector flow passage 113 may be disposed inside the first connector body 111. The first connector flow passage 113 may communicate with the air compressor 10. The first connector flow passage 113 may be provided to introduce air discharged from the air compressor 10. The first connector flow passage 113 may communicate with the air compressor connector flow passage 13.

Figure 9:
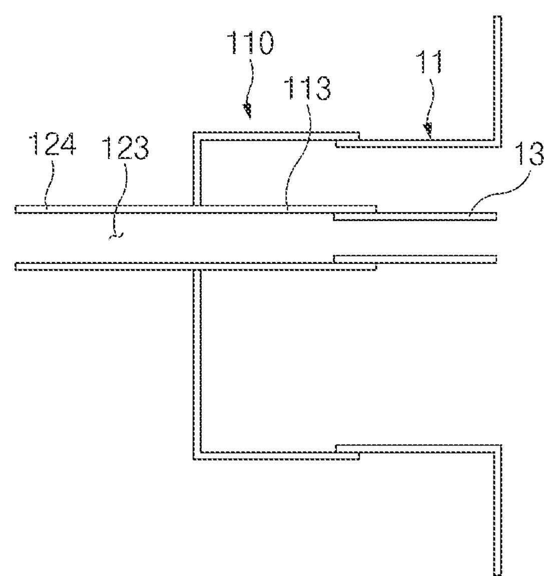
FIG. 9 is a sectional view illustrating a first connector flow passage having a diameter greater than a diameter of an air compressor connector flow passage, according to the first embodiment of the present disclosure.

FIG. 9 is a sectional view illustrating a first connector flow passage having a diameter greater than a diameter of an air compressor connector flow passage, according to the first embodiment of the present disclosure. As illustrated in FIG. 9, the diameter of the first connector flow passage 113 may be formed to be greater than the diameter of the air compressor connector flow passage 13. As the diameter of the first connector flow passage 113 is formed to be greater than the diameter of the air compressor connector flow passage 13, a portion of the air compressor connector flow passage 13 may be inserted into the first connector flow passage 113. As the portion of the air compressor connector flow passage 13 is inserted into the first connector flow passage 113, the airtightness between the air compressor connector flow passage 13 and the first connector flow passage 113 may be maintained.

Figure 10:
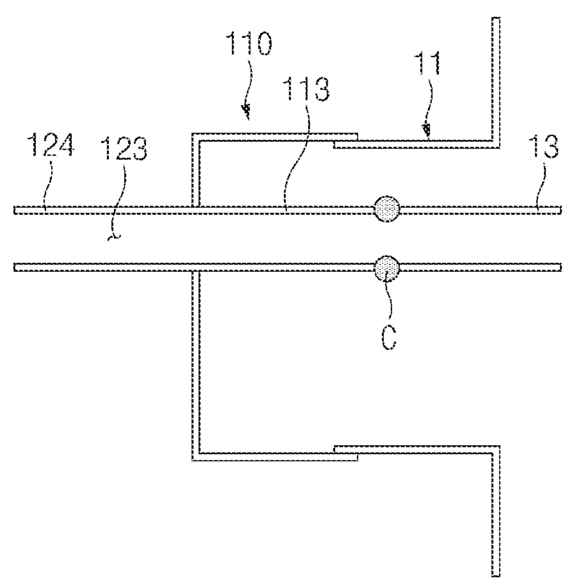
FIG. 10 is a sectional view illustrating that a first connector flow passage and an air compressor connector flow passage are sealed by a first sealing member, according to the first embodiment of the present disclosure.

FIG. 10 is a sectional view illustrating that a first connector flow passage and an air compressor connector flow passage are sealed by a first sealing member, according to the first embodiment of the present disclosure. According to another manner of maintaining the airtightness between the air compressor connector flow passage 13 and the first connector flow passage 113, the connector system 100 according to the first embodiment of the present disclosure may further include a first sealing member "C". The first sealing member C may seal a joint portion between the air compressor connector flow passage 13 and the first connector flow passage 113. As a joint portion between the air compressor connector flow passage 13 and the first connector flow passage 113 is sealed through the first sealing member C, the airtightness between the air compressor connector flow passage 13 and the first connector flow passage 113 may be maintained.

In the first connector body 111, a space in which the first connector terminal 112 is disposed may not be overlapped with a space in which the first connector flow passage 113 is disposed. In other words, the first connector flow passage 113 may be disposed in a dummy space of the first connector body 111 other than the space in which the first connector terminal 112 is disposed. As the space in which the first connector terminal 112 is disposed is separated from the space in which the first connector flow passage 113 is disposed, the first connector terminal 112 may be prevented from being deformed or broken by the hot air introduced into the first connector flow passage 113.

First Connection Line 120

Figure 11:
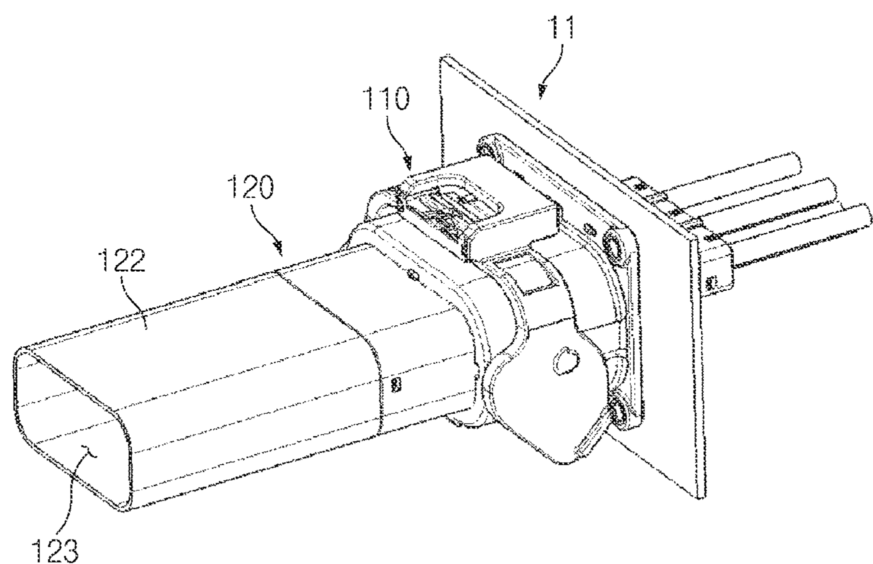
FIG. 11 is a perspective view illustrating that an air compressor connector is connected to a first connector, and a first connection line.
Figure 12:
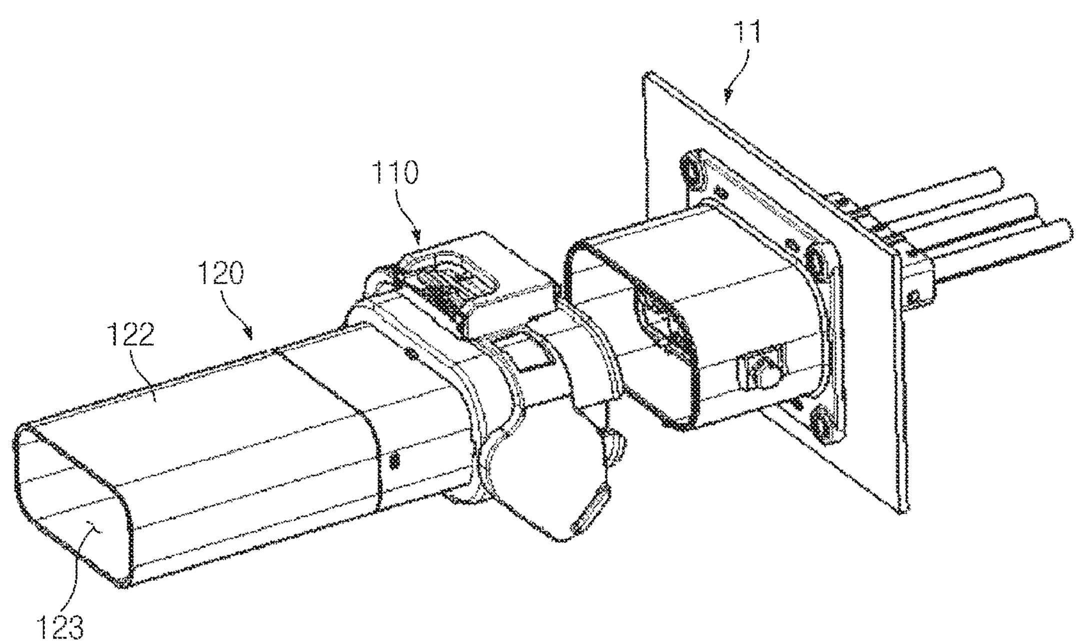
FIG. 12 is a perspective view illustrating an air compressor connector is separated from a first connector and a first connection line.

FIG. 11 is a perspective view illustrating that an air compressor connector is connected to a first connector and a first connection line. FIG. 12 is a perspective view illustrating that an air compressor connector is separated from a first connector and a first connection line.

As illustrated in FIGS. 11 and 12, the first connection line 120 may include the first connection line body 122 and a first connection line flow passage 123. The first connection line body 122 may be provided to surround the first cable 121 (see FIG. 6).

The first connection line flow passage 123 may be disposed inside the first connection line body 122. The first connection line flow passage 123 may communicate with the first connector flow passage 113. In the first connection line body 122, a space in which the first cable 121 is disposed may not be overlapped with a space in which the first connection line flow passage 123 is disposed.

The first connection line flow passage 123 is disposed to be spaced apart from the first cable 121, and includes a first connection pipe 124 to allow the first connector flow passage 113 to communicate with the second connector 130. In other words, the air discharged from the first connector flow passage 113 may be introduced into the first connection pipe 124. The first connection pipe 124 is disposed to be spaced apart from the first cable 121, to prevent the hot air, which is discharged from the first connector flow passage 113, from deforming or breaking the first cable 121.

However, a manner of forming the first connection line flow passage 123 is not limited to a manner of employing the first connection pipe 124. A space, which has no first cable 121, of an inner space of the first connection line body 122 may serve as the first connection line flow passage 123.

Second Connector 130

A second connector 130 may include a second connector body, a second connector terminal, and a second connector flow passage. The basic characteristics of the second connector 130 may be similar to that of the first connector 110.

The second connector body may be provided to be connected to a controller 20. The second connector body may be engaged with the first controller connector 22. The engagement between the second connector body and the first controller connector 22 may be similar to the above-described engagement between the first connector body 111 and the air compressor connector 11.

The second connector terminal may be disposed within the second connector body. The second connector terminal may be provided to be connected to the controller 20. In other words, the second connector terminal may be electrically connected to the terminal of the first controller connector 22.

The second connector flow passage may be disposed inside the second connector body. The second connector flow passage communicates with the first connection line 120, such that air discharged from the first connection line 120 may be introduced. The second connector flow passage may communicate with a controller inner flow passage 21. The relationship between the second connector flow passage and the controller inner flow passage may be similar to the above-described relationship between the first connector flow passage and the air compressor connector flow passage.

In the second connector body, a space in which the second connector terminal is disposed may not be overlapped with a space in which the second connector flow passage is disposed. In other words, the second connector flow passage may be disposed in a dummy space of the second connector body other than the space in which the second connector terminal is disposed. As the space in which the second connector terminal is disposed is separated from the space in which the second connector flow passage is disposed, the second connector terminal may be prevented from being deformed or broken by the hot air introduced into the second connector flow passage.

Controller 20

A second connector 130 may be provided to be electrically connected to the controller 20. The controller 20 may be provided to control the air compressor 10 to operate based on a user input.

The controller 20 may include a processor and a memory. The processor may include a microprocessor, such as a Field Programmable Gate Array (FPGA), an Application Specific Integrated Circuit (ASIC), and a Central Processing Unit (CPU). The memory may store control instructions that are the basis for generating instructions, which are used to determine the operation of the air compressor 10, in the processor. The memory may be a data store, such as a hard disk drive (HDD), a solid state drive (SSD), a volatile medium, or a non-volatile medium. The controller 20 may be disposed at an upper portion of the vehicle.

The controller 20 may include the first controller connector 22. The first controller connector 22 may be electrically connected to the controller 20. The second connector 130 may be engaged with the first controller connector 22. The basic feature of the first controller connector 22 may be similar to the air compressor connector 11.

The second connector 130 may communicate with one distal end of the controller inner flow passage 21. The controller inner flow passage 21 may be a flow passage extending through the inside of the controller 20. When the second connector 130 is connected to the controller 20, air discharged from the second connector 130 may be introduced into the controller inner flow passage 21.

The air discharged from the second connector 130 may be discharged to the outside through the controller inner flow passage 21 and a vent-out filter 30 coupled to an opposite distal end of the controller inner flow passage 21. The vent-out filter 30 may be a filter that discharges internal air and blocks water/dust from the outside.

U/V/W 3-Phase Terminal

The first connector terminal 112 may include a U/V/W three-phase terminal. The air compressor connector terminal 12 may include a U/V/W three-phase terminal having an opposite polarity to the polarity of the U/V/W three-phase terminal of the first connector terminal 112. The first cable 121 may include a three-phase cable connected to the U/V/W three-phase terminal of the first connector terminal 112.

Second Embodiment

Figure 13:
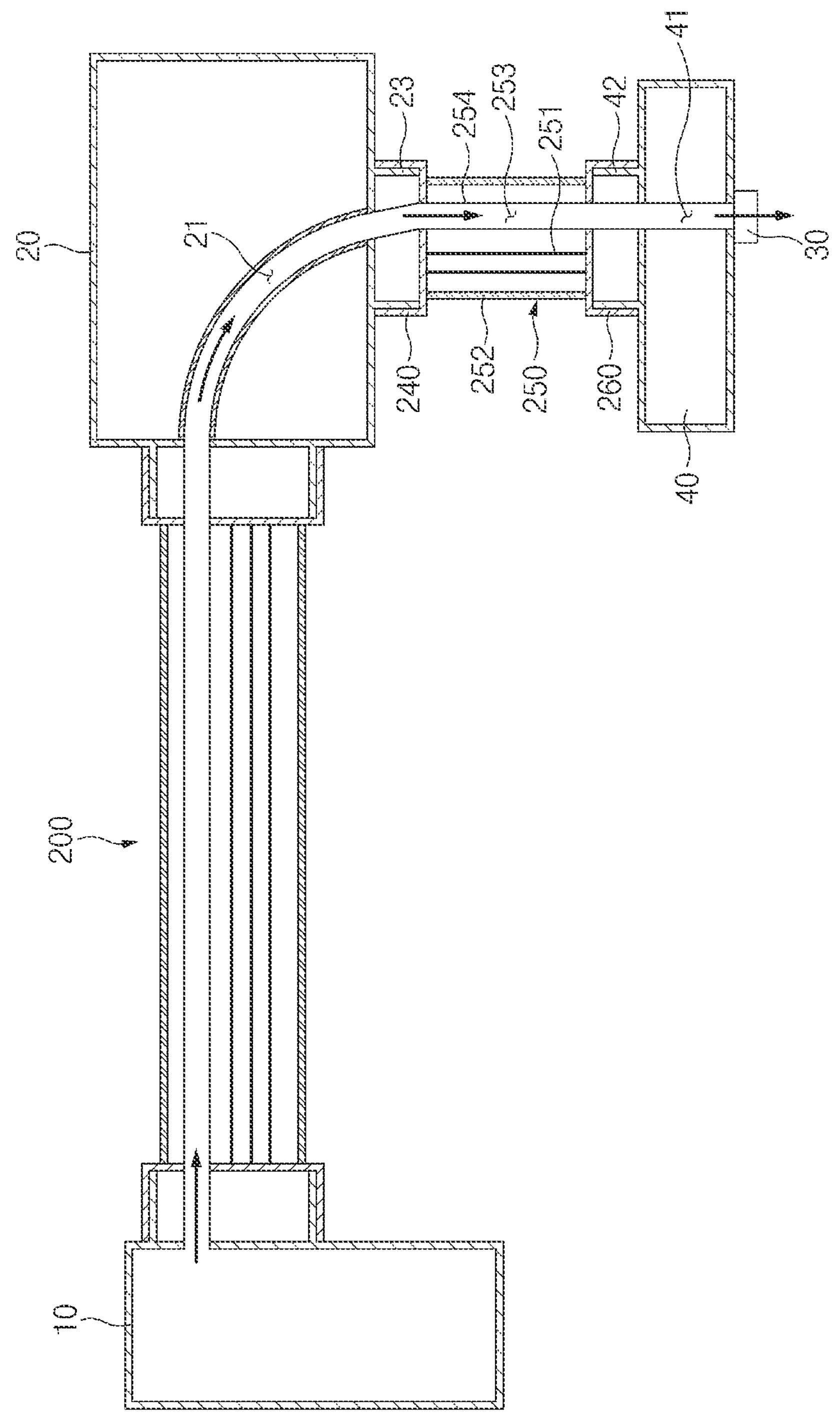
FIG. 13 is a view schematically illustrating a connector system, according to a second embodiment of the present disclosure.

FIG. 13 is a view schematically illustrating a connector system, according to a second embodiment of the present disclosure. Hereinafter, a connector system 200 will be described with reference to FIG. 13 according to a second embodiment of the present disclosure. The connector system 200 according to the second embodiment differs from the connector system wo according to the first embodiment in the presence of the second controller connector 23, the third connector 240, and the fourth connector 260. A component that is the same or similar to that of the connector system wo according to the first embodiment will be assigned with the same reference numeral or the similar reference numeral, and the details thereof will be omitted.

Controller Connected to Connector System According to Second Embodiment

Figure 14:
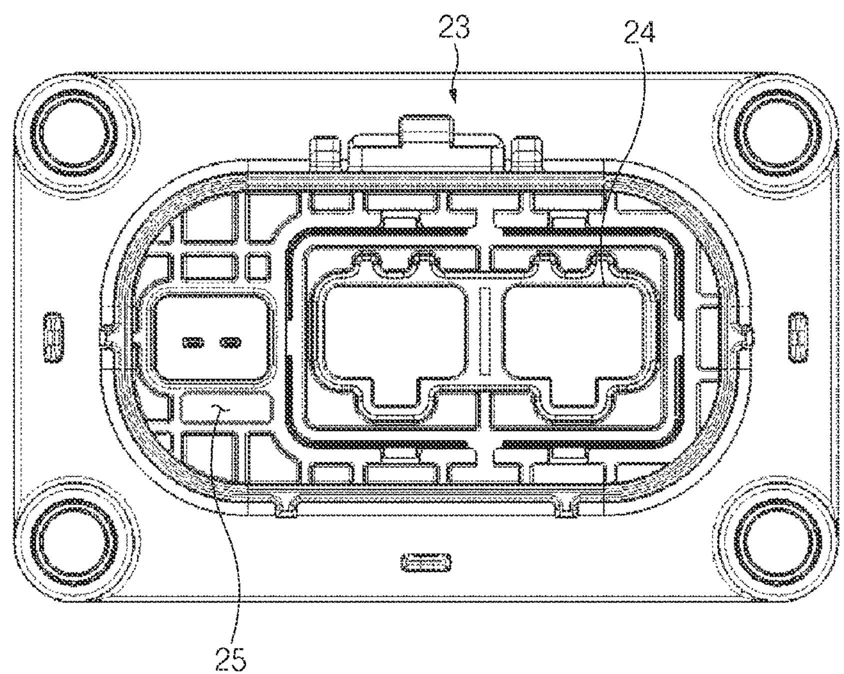
FIG. 14 is a sectional view of a second controller connector.

The controller 20 to which the connector system according to the second embodiment of the present disclosure is connected may further include the second controller connector 23. FIG. 14 is a sectional view of a second controller connector 23. The second controller connector 23 may be electrically connected to the controller 20.

As illustrated in FIG. 14, the second controller connector 23 may include a second controller connector terminal 24 and a second controller connector flow passage 25. The second controller connector terminal 24 may be disposed within the second controller connector 23. The second controller connector terminal 24 may be provided to be electrically connected to the controller 20. The air discharged from the controller 20 may be introduced into the second controller connector flow passage 25.

Basic Configuration of Connector System 200 According to Second Embodiment

According to the second embodiment of the present disclosure, the connector system 200 may further include a third connector 240, a second connection line 250, and a fourth connector 260. The third connector 240 may be engaged with the second controller connector 23. The third connector 240 may communicate with an opposite distal end of the controller inner flow passage 21. The vent-out filter 30 is not mounted on an opposite distal end of the controller inner flow passage 21 in the connector system 200 according to the second embodiment, which differs from the connector system 100 according to the first embodiment.

The second connection line 250 may be provided to surround the second cable 251. The second cable 251 may be electrically connected to the third connector 240. One side of the second connection line 250 may be connected to the third connector 240. The fourth connector 260 may be connected to an opposite side of the second connection line 250. The fourth connector 260 may be electrically connected to the second cable 251.

The third connector 240, the second connection line 250, and the fourth connector 260 may communicate with each other. As the third connector 240, the second connection line 250, and the fourth connector 260 may communicate with each other, the air introduced from the controller inner flow passage 21 to the third connector 240 may be discharged through the fourth connector 260 via the second connection line 250.

Third Connector 240

The third connector 240 may include a third connector body, a third connector flow passage, and a third connector terminal. The third connector body may be provided to be connected to the controller 20. The third connector terminal may be disposed inside the third connector body. The third connector terminal may be provided to be electrically connected to the controller 20. In other words, the third connector terminal may be electrically connected to the second controller connector terminal 24.

The third connector terminal may be disposed in the third connector body. The third connector flow passage communicates with the controller inner flow passage 21 such that air discharged from the controller inner flow passage 21 is introduced into the third connector flow passage.

In the third connector body, a space, in which the third connector terminal is disposed, may not be overlapped with a space in which the third connector flow passage is disposed. In other words, the third connector flow passage may be disposed in a dummy space of the third connector body other than the space in which the third connector terminal is disposed. As the space in which the third connector terminal is disposed is separated from the space in which the third connector flow passage is disposed, the third connector terminal may be prevented from being deformed or broken by the hot air introduced into the third connector flow passage.

Second Connection Line 250

The second connection line 250 may include a second connection line body 252 and a second connection line flow passage 253. The second connection line body 252 may be provided to surround the second cable 251.

The second connection line flow passage 253 may communicate with the third connector flow passage. The second connection line flow passage 253 may be disposed inside the second connection line body 252. In the second connection line body 252, a space in which the second cable 251 is disposed may not be overlapped with a space in which the second connection line flow passage 253 is disposed.

The second connection line flow passage 253 is disposed to be spaced apart from the second cable 251, and includes a second connection pipe 254 to allow the third connector flow passage to communicate with the fourth connector 260. In other words, the air discharged from the third connector flow passage may be introduced into the second connection pipe 254. The second connection pipe 254 is disposed to be spaced apart from the second cable 251, thereby preventing the second cable 251 from being deformed or broken by the hot air introduced into the second connector flow passage.

However, a manner of forming the second connection line flow passage 253 is not limited to a manner of employing the second connection pipe 254. A space, which has no second cable 251, of an inner space of the second connection line body 252 may serve as the second connection line flow passage 253.

Fourth Connector 260

The fourth connector 260 may include a fourth connector body, a fourth connector terminal, and a fourth connector flow passage. The fourth connector body may be provided to be connected to a junction box 40. The fourth connector terminal may be disposed inside the fourth connector body. The fourth connector terminal may be provided to be electrically connected to the controller 20. The fourth connector flow passage communicates with the second connection line 250, such that air withdrawn from the second connection line 250 may be introduced. In other words, the fourth connector flow passage may communicate with the second connection line flow passage 253. The basic characteristics of the fourth connector 260 may be similar to that of the third connector 240.

In the fourth connector body, a space in which the fourth connector terminal is disposed may not be overlapped with a space in which the fourth connector flow passage is disposed. In other words, the fourth connector flow passage may be disposed in a dummy space of the fourth connector body other than the space in which the fourth connector terminal is disposed. As the space in which the fourth connector terminal is disposed is separated from the space in which the fourth connector flow passage is disposed, the fourth connector terminal may be prevented from being deformed or broken by the hot air introduced into the fourth connector flow passage.

Junction Box 40

The fourth connector 260 may be provided to be electrically connected to the junction box 40. The junction box 40 may be disposed at an upper portion of the vehicle. In this case, the junction box 40 may be disposed above the controller 20. The junction box 40 may include a junction box connector 42. The junction box connector 42 may be electrically connected to the junction box 40.

The fourth connector 260 may be electrically connected to the junction box connector 42. The basic feature of the junction box connector 42 may be similar to the second controller connector 23.

The fourth connector 260 may communicate with one distal end of a junction box inner flow passage 41. The junction box inner flow passage 41 may be a flow passage extending through an inner part of the junction box 40. When the fourth connector 260 is connected to the junction box 40, air discharged from the fourth connector 260 may be introduced into the junction box inner flow passage 41. The air discharged from the fourth connector 260 may be discharged to the outside through the junction box inner flow passage 41 and a vent-out filter 30 coupled to an opposite distal end of the junction box inner flow passage 41.

"+/−" Single-Phase Terminal

The third connector terminal may include a +/− single-phase terminal. The second controller connector terminal 24 may include a +/− single-phase terminal having the opposite polarity to the polarity of the +/− single-phase terminal of the third connector terminal. The second cable 251 may include a single-phase cable connected to the +/− single-phase terminal of the third connector terminal.

Hereinafter, the whole flowing path of the air in the connector system 200 will be described according to the second embodiment. The air discharged from the air compressor 10 may be discharged to the outside through the vent-out filter 30 after sequentially passing through the first connector 110, the first connection line 120, the second connector 130, the controller inner flow passage 21, the third connector 240, the second connection line 250, and the fourth connector 260.

Third Embodiment

Figure 15:
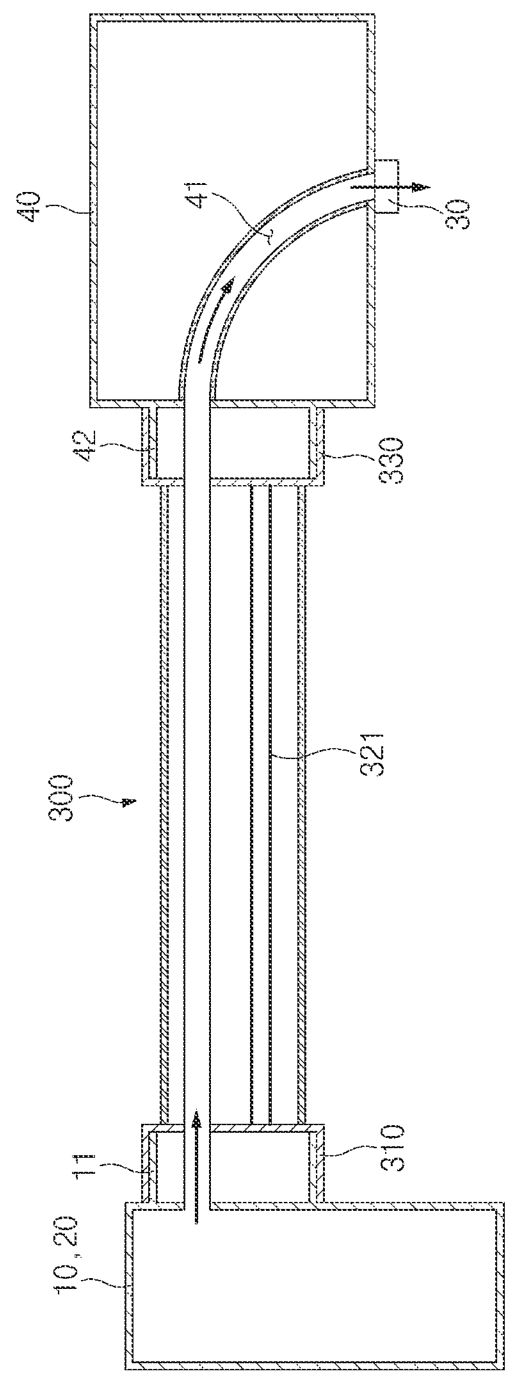
FIG. 15 is a view schematically illustrating a connector system, according to a third embodiment of the present disclosure.

FIG. 15 is a view schematically illustrating a connector system, according to a third embodiment of the present disclosure. Hereinafter, a connector system 300 will be described with reference to FIG. 15 according to a third embodiment of the present disclosure. The connector system 300 according to the third embodiment differs from the connector system according to the first embodiment in terms of a connection target of the second connector 130. A component that is the same as or similar to that of the connector system according to the first embodiment will be assigned with the same reference numeral or the similar reference numeral, and the details thereof will be omitted.

According to the third embodiment, the air compressor 10 of the connector system 300 may be configured integrally with the controller 20. In this case, according to the third embodiment, the second connector 330 of the connector system 300 may be provided to be electrically connected to the junction box 40. In other words, the second connector 330 may be engaged with the junction box connector 42.

The second connector 330 may communicate with one distal end of a junction box inner flow passage 41. The junction box inner flow passage 41 may be a flow passage extending through an inner part of the junction box 40. When the second connector 330 is connected to the junction box 40, air discharged from the second connector 330 may be introduced into the junction box inner flow passage 41.

+/− Single-Phase Terminal

According to the third embodiment, the first connector 310 of the connector system 300 may include a +/− single-phase terminal. According to the third embodiment, the air compressor connector terminal 12 of the connector system 300 may include a +/− single-phase terminal having an opposite polarity to the polarity of the +/− single-phase terminal of the first connector 310. According to the third embodiment, the first cable 321 of the connector system 300 may include a single-phase cable connected to the +/− single-phase terminal of the first connector 310.

As described above, according to embodiments of the present disclosure, the flow passage, which is to discharge hot air generated from the predetermined device required for air discharge, is formed in the connector for the electrical connection, thereby forming an additional flow passage separated from the system exhaust. Accordingly, the hot air may be transferred to the outside without the pressure reversal resulting from the system exhaust, thereby preventing the damage to the device due to the pressure reversal.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims. Therefore, the exemplary embodiments of the present disclosure are provided to explain the spirit and scope of the present disclosure, but not to limit them, so that the spirit and scope of the present disclosure is not limited by the embodiments. The scope of the present disclosure should be construed on the basis of the accompanying claims, and all the technical ideas within the scope equivalent to the claims should be included in the scope of the present disclosure.

What is claimed is:

1. A connector system comprising:

a first connector configured to be electrically connected to a predetermined device required for air discharge and to introduce air discharged from the predetermined device into the first connector;

a first connection line surrounding a first cable electrically connected to the first connector, one side of the first connection line being connected to the first connector; and a second connector connected to an opposite side of the first connection line and electrically connected to the first cable, wherein the first connector, the first connection line, and the second connector are configured to communicate with each other such that the air introduced into the first connector is discharged through the second connector after passing through the first connection line.

2. The connector system of claim 1, wherein the second connector is configured to be electrically connected to a controller configured to control the predetermined device.

3. The connector system of claim 2, wherein the second connector is configured to communicate with one distal end of a controller inner flow passage, when connected to the controller, such that the air discharged from the second connector is introduced into the controller inner flow passage which extends through an inner part of the controller.

4. The connector system of claim 3, further comprising a vent-out filter coupled to an opposite distal end of the controller inner flow passage is configured to discharge the air discharged from the second connector to an outside after the discharged air passes through the controller inner flow passage.

5. The connector system of claim 3, further comprising:

a third connector coupled to an opposite distal end of the controller inner flow passage;

a second connection line provided to surround a second cable electrically connected to the third connector, one side of the second connection line being connected to the third connector; and a fourth connector connected to an opposite side of the second connection line and electrically connected to the second cable, wherein the third connector, the second connection line, and the fourth connector are configured to communicate with each other such that air introduced into the third connector from the controller inner flow passage is discharged through the fourth connector after passing through the second connection line.

6. The connector system of claim 5, wherein the fourth connector is configured to be electrically connected to a junction box.

7. The connector system of claim 6, wherein the fourth connector is configured to communicate with one distal end of a junction box inner flow passage, when connected to the junction box, such that the air discharged from the fourth connector is introduced into the junction box inner flow passage which extends through an inner part of the junction box.

8. The connector system of claim 7, further comprising a vent-out filter coupled to an opposite distal end of the junction box inner flow passage is configured to discharge the air discharged from the fourth connector to an outside after the discharged air passes through the junction box inner flow passage.

9. The connector system of claim 1, wherein the second connector is configured to be electrically connected to a junction box.

10. The connector system of claim 9, wherein the second connector is configured to communicate with one distal end of a junction box inner flow passage, when connected to the junction box, such that the air discharged from the second connector is introduced into the junction box inner flow passage which extends through an inner part of the junction box.

11. The connector system of claim 1, wherein the first connector comprises:

a first connector body configured to be connected to the predetermined device;

a first connector terminal disposed in the first connector body and configured to be electrically connected to the predetermined device; and a first connector flow passage disposed in the first connector body and configured to communicate with the predetermined device such that the air discharged from the predetermined device is introduced into the first connector flow passage, wherein a space in which the first connector terminal is disposed is not overlapped with a space in which the first connector flow passage is disposed in the first connector body.

12. The connector system of claim 11, wherein the first connection line comprises:

a first connection line body surrounding the first cable; and a first connection line flow passage provided in the first connection line body and configured to communicate with the first connector flow passage, wherein a space in which the first cable is disposed is not overlapped with a space in which the first connection line flow passage is disposed in the first connector body.

13. The connector system of claim 12, wherein a diameter of the first connection line flow passage is greater than a diameter of the first connector flow passage such that a portion of the first connector flow passage may be inserted into the first connection line flow passage.

14. The connector system of claim 12, further comprising a first sealing member configured to seal a joint part between the first connection line flow passage and the first connector flow passage.

15. The connector system of claim 12, wherein the first connection line flow passage comprises a first connection pipe spaced apart from the first cable and configured to allow the first connector flow passage to communicate with the second connector.

16. The connector system of claim 11, wherein the first connector terminal comprises a U/V/W three-phase terminal, wherein the first cable includes a three-phase cable connected to the U/V/W three-phase terminal.

17. The connector system of claim 1, wherein the predetermined device includes one of an air compressor, a water pump, or an air fan.

18. The connector system of claim 1, wherein the predetermined device includes an airfoil bearing in the predetermined device, and wherein the air discharged from the predetermined device is air heated after cooling the airfoil bearing.

19. A connector system comprising:

a first connector configured to be electrically connected to a predetermined device required for air discharge and to introduce air discharged from the predetermined device into the first connector;

a first connection line surrounding a first cable electrically connected to the first connector, one side of the first connection line being connected to the first connector; and a second connector connected to an opposite side of the first connection line and electrically connected to the first cable, and configured to be electrically connected to a controller configured to control the predetermined device, the second connector comprising:

a second connector body configured to be connected to the controller;

a second connector terminal disposed in the second connector body and configured to be electrically connected to the controller; and a second connector flow passage disposed in the second connector body;

wherein a space in which the second connector terminal is disposed is not overlapped with a space in which the second connector flow passage is disposed in the second connector body;

wherein the first connector, the first connection line, and the second connector are configured to communicate with each other such that the air introduced into the first connector is discharged through the second connector after passing through the first connection line; and wherein the second connector flow passage is configured to communicate with the first connection line such that the air discharged from the first connection line is introduced into the second connector flow passage.

* * * * *